United States Patent [19]

Sugino et al.

[11] Patent Number: 5,895,607
[45] Date of Patent: Apr. 20, 1999

[54] ELECTRICALLY CONDUCTIVE CASINGS FOR ELECTRONIC DEVICES

[75] Inventors: Morihiko Sugino; Yasuo Hirano; Yoshiteru Sese; Naoki Kikuchi; Kei Takara, all of Kobe, Japan

[73] Assignee: Kabushiki Kaisha Kobe Seiko Sho, Kobe, Japan

[21] Appl. No.: 08/953,784

[22] Filed: Oct. 17, 1997

[30] Foreign Application Priority Data

Oct. 18, 1996 [JP] Japan ................................. 8-276662

[51] Int. Cl.$^6$ .................. H01B 1/24; B32B 27/20; B32B 27/34
[52] U.S. Cl. ................. 252/511; 428/244; 428/922
[58] Field of Search ................. 252/511; 428/244, 428/922

[56] References Cited

U.S. PATENT DOCUMENTS

| 5,500,473 | 3/1996 | Wissmann | 524/447 |
| 5,561,193 | 10/1996 | Gottschalk et al. | 525/63 |

FOREIGN PATENT DOCUMENTS

| 4-167304 | 6/1992 | Japan . |
| 6-240132 | 8/1994 | Japan . |

OTHER PUBLICATIONS

Database WPI, Derwent Publications, AN 95–094003, JP 7–018180, Jan. 20, 1995.

Database WPI, Derwent Publications, AN 92–020295, JP 3–269056, Nov. 29, 1991.

*Primary Examiner*—Mark Kopec
*Attorney, Agent, or Firm*—Oblon, Spivak, McClelland, Maier & Neustadt, P.C.

[57] ABSTRACT

An electrically conductive casing for an electronic device comprising a molded article which is comprised of a fiber-reinforced plastic composition comprising carbon fiber and polyamide, said polyamide comprising semi-aromatic polyamide and aliphatic polyamide in a weight ratio of 10:90 to 90:10, wherein said semi-aromatic polyamide is a polymer of an aromatic diamine and an aliphatic dicarboxylic acid.

11 Claims, No Drawings

ELECTRICALLY CONDUCTIVE CASINGS FOR ELECTRONIC DEVICES

BACKGROUND OF THE INVENTION

1. Field of the Invention

The present invention relates to an electrically conductive casing for electronic devices formed using a fiber-reinforced plastic composition containing reinforcing carbon fibers having electrical conductivity and polyamides as matrix components.

2. Description of the Related Arts

Plastic molded articles have been widely used in casings for electronic devices, such as portable office automation (OA) devices, audio visual (AV) devices and portable phones. These casings require antistatic characteristics and electromagnetic shielding characteristics in order to prevent leakage of electromagnetic waves, which are generated in high-frequency circuits and, which affect other electronic parts and circuits, and to prevent invasion of electromagnetic waves from the outside which will cause erroneous operation of electronic circuits in the casings.

A typical method to furnish casings with antistatic characteristics is to coat antistatic paints and a typical electromagnetic wave shielding method is to plate the casing surfaces. These methods, however, cause an increase in the product costs due to an increase in the number of production steps. Further, the antistatic coating layer or the plating layer will be peeled off due to external forces, such as impact, when in use, resulting in a deterioration of the antistatic or shielding effects.

Additionally, portable electronic devices have spread rapidly in recent years. Although these portable devices must be lightweight, it is difficult to reduce the weight of conventional plastic casings because they have a thickness such that the minimum rigidity required for protecting the electronic devices is achieved.

In order to solve the above-mentioned problems, lightweight and rigid casings have been developed using composite materials, i.e., fiber-reinforced and especially carbon fiber-reinforced plastics. A typical example of materials used for such casings is disclosed in Japanese Patent Laid-open No. 4-167304 in which carbon particles and carbon fibers are compounded in a crystalline polymer. A warpage will occasionally occur, however, due to inhomogeneous crystallization as described in this patent, and it is difficult to use the composition for thin molded articles. A proposed method for solving this problem is to use polymer alloys in which amorphous resins are compounded into crystalline polymers. Since amorphous resins have generally low flowability, the polymer alloys also have low flowability compared with the sole use of crystalline polymers. It is therefore difficult to obtain thin-wall molded articles from polymer alloys due to increased molding pressures and temperatures. Widely used plastics include amorphous resins, such as polycarbonates and modified polyphenylene ethers, and semi-aromatic polyamides, which have a smaller mold shrinkage on molding and thus high dimensional accuracy, and a smaller warpage in thin molded articles. These amorphous resins, however, generally have poor flowability, and both the amorphous resins and the semi-aromatic polyamides have low impact resistance when these resins are reinforced with carbon fibers.

The impact resistance will now be described in detail with reference to notebook-type personal computers which are provided with carbon fiber-reinforced plastic casings having high impact resistance. Notebook-type personal computers have weights in a range from 1 to 3 kg and require high electromagnetic wave shielding characteristics. Many electronic parts are packed into a casing to enable versatile usage, and thus these parts occupy a large volume. The casing therefore requires a reduction of weight and thickness. On the other hand, portable electronic devices must have high impact resistance, which is expressed as follows.

A box casing having a height of 20 to 50 mm, a length of 250 to 350 mm, a width of 160 to 260 mm, a thickness of 1.0 to 1.5 mm and a weight of $W_0$ (g) is prepared in which boundaries between two side walls and between one side wall and the bottom wall have an inner curvature of 0.1 mmR or more and an outer curvature of 0.7 mmR or less and a thickness of 0.7 mm or more. A metal plate having a weight of $W_1$ (g) and cut so as to come into contact with the four side walls of the casing is fixed to the bottom wall of the casing. When dropping the box casing onto a wood plate such that a corner between a boundary of two side walls and the bottom face is at the lowest position, the height forming casing cracks satisfies the following equation (I):

$$h > 45/(W_0 + W_1) \qquad (I)$$

For example, the height forming casing cracks is 4.5 cm or more for a notebook-type personal computer of 1 kg, or 2.25 cm or more for a computer of 2 kg. No electronic device casings made of conventional carbon fiber-reinforced plastic materials satisfy such a criterion. For example, a notebook-type personal computer of 3 kg covered with a casing made of a carbon fiber-reinforced semi-aromatic polyamide has a height of 5 to 10 mm according to the above method.

SUMMARY OF THE INVENTION

It is an object of this invention to provide a thin electrically conductive casing for an electronic device which has excellent antistatic and electromagnetic wave shielding characteristics, reduced weight and rigidity, and satisfies the impact resistance criterion expressed by the above equation (I).

An electrically conductive casing for an electronic device in accordance with the present invention comprises a molded article which is comprised of a fiber-reinforced plastic composition comprising carbon fiber and polyamide, the polyamide comprising semi-aromatic polyamide and aliphatic polyamide in a weight ratio of 10:90 to 90:10.

Preferably, the semi-aromatic polyamide is a polymer of an aromatic diamine, particularly m-xylylenediamine, and an aliphatic dicarboxylic acid, particularly adipic acid.

Preferably, the aliphatic polyamide is nylon 6 or nylon 66.

Preferably, at least 30 percent by weight of the carbon fiber has a length of 0.1 mm or more.

Preferably, the weight ratio of the carbon fiber to the polyamide is in a range from 10:90 to 45:55.

Preferably, the molded article has a flexural modulus in a range from 1,000 kgf/mm$^2$ to 4,500 kgf/mm$^2$.

Preferably, the fiber-reinforced plastic composition has a spiral flow length of 100 mm or more at a 1.2-mm thickness under conditions of a resin temperature of 280° C., a mold temperature of 80° C. and an injection pressure of 1,500 kgf/cm$^2$.

Preferably, the fiber-reinforced plastic composition further comprises a flame retardant and conforms UL94 V-O within a thickness range from 0.7 to 1.2 mm.

Preferably, the flame retardant is red phosphorus, or comprises red phosphorus and an inorganic compound.

Preferably, the electrically conductive casing has an electromagnetic shielding of 35 dB or more at a frequency of 300 MHz determined by a Kansai Electronic Development Center (KMC) method or has a resistance of 20 Ω or less between two metal nuts inserted into the casing at an interval of 120 mm.

DETAILED DESCRIPTION OF THE PREFERRED EMBODIMENTS

The casing in accordance with the present invention is made of a fiber-reinforced plastic composition composed of conductive carbon fiber as a reinforcement and polyamide resins, has a thin wall and is used for electronic devices. The polyamide resins are composed of 10 to 90 parts by weight of semi-aromatic polyamide and 90 to 10 parts by weight of aliphatic polyamide.

As described above, typical conventional plastics reinforced by carbon fiber include amorphous resins, such as polycarbonates and modified polyphenylene ethers, and semi-aromatic polyamides, and carbon fiber-reinforced resins thereof have a small molding shrinkage and thus high dimensional accuracy, and a small warpage in casings, whereas they have poor flowability during molding and low impact resistance of the molded article not satisfying the strength criteria expressed by the above-mentioned equation (I).

Although use of aliphatic polyamides is conceivable in order to overcome the problems due to the semi-aromatic polyamide, sole use of an aliphatic polyamide in a carbon fiber-reinforced plastic results in decreased rigidity of the molded article, and causes deterioration of the protective characteristics. The rigidity further decreases when moisture is absorbed. Typical aliphatic polyamides, e.g. nylon 6 and nylon 66, decrease the rigidity and change the dimensions of the molded article due to high hygroscopic characteristics. Low hygroscopic aliphatic polyamides, e.g. nylon 11 and nylon 12, also have low rigidity in carbon fiber-reinforced compositions, and thus are unsuitable as materials for thin casings.

The present inventors have studied the improvement measures for impact resistance and have discovered that combined use of a semi-aromatic polyamide and an aliphatic polyamide in a given ratio can significantly improve the impact resistance of thin casings composed of carbon fiber-reinforced plastics without deteriorating antistatic and electromagnetic shielding characteristics. The present invention therefore has been completed.

In the present invention, preferably the weight ratio of the carbon fiber to the polyamide resin is in a range from 10:90 to 45:55 in the carbon fiber-reinforced plastic composition forming the casing. A carbon content of less than 10 parts by weight results in a casing having an unsatisfactory level of rigidity, electrical conductivity and antistatic and electromagnetic shielding characteristics. When the carbon fiber content exceeds 45 parts by weight, the flowability of the fiber-reinforced plastic composition decreases and have a difficulty in the formation of a thin-wall casing.

The present invention is characterized by combined use of 10 to 90 parts by weight of semi-aromatic polyamide and 90 to 10 parts by weight of aliphatic polyamide, as described above, in order to overcome the above-mentioned problems without lessening the advantages of the semi-aromatic polyamide. When less than 10 percent of semi-aromatic polyamide is compounded, the resulting casing has low rigidity. Its rigidity further decreases and the size changes due to moisture absorption. On the other hand, a semi-aromatic polyamide content of over 90 parts by weight reveals the above-mentioned disadvantages of semi-aromatic polyamide, that is, prominently decreases the impact resistance of the casing.

The semi-aromatic polyamide used in the present invention may be synthesized by condensation of a diamine with a dicarboxylic acid. The types and combination of the diamine and the dicarboxylic acid are not limited in the present invention so that either the diamine or the dicarboxylic acid may have an aromatic ring while the other may have an $\alpha$, $\omega$-unbranched aliphatic unit. Examples of diamines include m-xylylenediamine, p-xylylenediamine and mixtures thereof, and examples of dicarboxylic acids include adipic acid and sebacic acid. A preferred semi-aromatic polyamide is a condensation product of m-xylylenediamine with adipic acid. A combination of o-phthalic acid and hexamethylenediamine is also preferable.

Examples of useful aliphatic polyamides include polymers and copolymers prepared from ε-caprolactam, 6-aminocaproic acid, ω-enanthocaprolactam, 7-aminoheptanoic acid, 11-aminoundecanoic acid, 9-aminononanoic acid, α-pyrrolidone and α-piperidone; polymers and copolymers prepared by condensation of a diamine, e.g. hexamethylenediamine, nonamethylenediamine, undecamethylenediamine or dodecamethylenediamine, with a dicarboxylic acid, e.g. adipic acid or sebacic acid; and blends thereof. Among these, nylon 6 and nylon 66 are preferred, from the view point of availability, material costs, flowability or moldability of the resulting carbon fiber-reinforced plastic composition and physical properties of the resulting casing.

The casing in accordance with the present invention can be made by forming a fiber-reinforced plastic composition, in which a mixture of the semi-aromatic polyamide and the aliphatic polyamide in a given ratio is reinforced with a given amount of carbon fiber, in a conventional manner. It is preferred that the carbon fiber in the casing be as long as possible, because a longer carbon fiber not only effectively improves the rigidity of the casing, but also enhances antistatic and electromagnetic shielding characteristics due to increased conductivity by entanglement of carbon fibers.

In order to draw out the advantages of the long carbon fiber, the ratio of the carbon fiber having a length of 0.1 mm or more in the casing is 30 percent by weight or more, preferably 50 percent by weight, and more preferably 60 percent by weight. The content of the long carbon fiber in the casing can be determined by, for example, a real time image analyzer, e.g. trade name "LUZEX FS" made by Nireco Corporation. Since the length of the carbon fiber decreases in a mixing step with the polyamide resin, an extruding step and an injection step, it is preferred that a relatively long carbon fiber be used in the mixing step with the polyamide resin. More specifically, use of long fiber pellets as a mixed raw material of carbon fiber and a polyamide resin are preferred.

The long fiber pellets are made as follows. Continuous reinforcing fibers are passed through a molten thermoplastic resin to impregnate the reinforcing fibers with the thermoplastic resin, then cooled and cut into a predetermined length, e.g. 5 to 10 mm. The pellets therefore contain long reinforcing fibers, and the reinforcing fiber having an appropriate length can be readily obtained by adjusting the cutting length.

In the present invention, a polyamide mixture of a semi-aromatic polyamide and an aliphatic polyamide was melted by heat, a continuous carbon fiber bundle was passed through the melted polyamide mixture to impregnate the carbon fiber bundle with the polyamide resin. The resulting strand is cut into long fiber pellets having a given length. The long fiber pellets can be used in the present invention. The length of the fiber in the pellet is determined so that the flowability of the resin does not excessively decrease and the nozzle does not clog during injection molding. The content of the long carbon fibers in the casing can be controlled thereby without affecting the moldability.

The carbon fiber-reinforced plastic composition in accordance with the present invention is not limited to the above-mentioned long fiber pellet. Another example of a usable carbon fiber-reinforced plastic composition includes preformed pellets made by mixing a polyamide mixture of the semi-aromatic polyamide and the aliphatic polyamide with chopped strand carbon fibers in an extruding kneader, extruding the composition through the die and preforming the composition into pellets. Alternatively, the polyamide mixture and the carbon fibers are mixed in an extruding kneader immediately before the injection molding and the kneaded composition is directly fed into the injection molding machine from the extruding kneader.

The electronic device casings in accordance with the present invention having a predetermined shape are generally formed from the above-mentioned pellets containing long carbon fibers by an injection molding process. The moldability in the injection molding process greatly depends on the flowability of the melted composition. The composition therefore must be prepared in view of the flowability of the melted composition. Specifically, the length and amount of the carbon fiber, the molecular weights and the mixing ratio of the semi-aromatic polyamide and the aliphatic polyamide are adjusted, and a lubricant may be added if necessary to adjust the flowability of the melted composition. Preferably, the melted composition has a spiral flow length of 100 mm or more and more preferably 120 mm or more at a 1.2-mm thickness under conditions of a resin temperature of 280° C., a mold temperature of 80° C. and an injection pressure of 1,500 kgf/cm². Injection molding can be satisfactorily conducted when the types and ratio of the raw materials are adjusted so as to maintain such a flowability.

The raw material for the casing in accordance with the present invention is composed of carbon fiber, a semi-aromatic polyamide and an aliphatic polyamide, as described above, and may further contain flame-retardants in order to enhance the flame retardance of the casing. The types of flame retardant are not limited in the present invention and include any known flame retardants, e.g. bromine-containing and phosphorus-containing flame retardants. Red phosphorus and mixtures of red phosphorus and inorganic compounds, e.g. magnesium hydroxide, are preferably used. In particular, thecombination of red phosphorus and magnesium hydroxide can achieve a high level of flame-retardance with a relatively small amount of red phosphorus. These flame retardants may be preliminarily mixed in a step for preparing the raw molding material such as long fiber pellets or may be added to the melted composition before injection molding. It is recommended that the amount of flame retardant is adjusted so as to satisfy UL94 V-O within a thickness range from 0.7 to 1.2 mm in a practical view point.

A preferred content of the red phosphorus flame retardant is from 2 to 10 percent by weight, and specifically from 3 to 7 percent by weight of the total amount of the fiber-reinforced plastic composition. When red phosphorus is used together with an inorganic compound such as magnesium hydroxide, satisfactory flame-retardance can be achieved by reducing the amount of red phosphorus.

The fiber-reinforced plastic composition in accordance with the present invention may contain other additives, e.g. an antioxidant, a thermal stabilizer, an ultraviolet absorbent, a pigment and a coloring agent if necessary. The composition may further contain a nonconductive reinforcing fiber such as glass fiber or an organic fiber and an inorganic or organic filler.

Although a typical method for molding the casing from the above-mentioned composition is an injection molding method, the method in accordance with the present invention is not limited to the injection molding method and may be another molding method, for example, a compression molding or injection-compression molding method. In the molding process of, for example, a casing for an electronic device, such as a notebook-type personal computer, it is preferred that the thickness of the main section of the casing be 1.5 mm or less in view of weight and size reductions and be within a range from 0.5 to 1.5 mm. In the present invention, the resulting casing has a flexural modulus of 1,000 to 4,500 kgf/mm² and satisfies the criteria of the impact resistance represented by the above-mentioned equation (I).

In the casing in accordance with the present invention containing a specified content of carbon fiber, antistatic and electromagnetic shielding characteristics can be significantly improved by controlling the electromagnetic shielding to 35 dB or more, and preferably 40 dB or more at a frequency of 300 MHz determined by a Kansai Electronic Development Center (KMC) method or controlling the resistance between two metal nuts inserted into the casing at an interval of 120 mm to 20 Ω or less, and preferably 15 Ω or less in which the casing contains a personal computer with a CPU or a similar electronic device.

EXAMPLES

The present invention will now be described in detail with reference to the examples, although not limited to these examples. The present invention further includes variations and modifications within the scope without departing from the spirit of the invention.

Example 1

A resin blend containing 50 parts by weight of a semi-aromatic nylon (trade name: Reny, made by Mitsubishi Engineering-Plastics Corporation) and 50 parts by weight of nylon 6 (trade name Amilan, made by Toray Industries, Inc.), and carbon fiber were kneaded in and extruded from an extruder to prepare carbon fiber-reinforced pellets. The pellets contained 30.5 percent by weight of carbon fiber.

The spiral flow length at a 1.2-mm thickness which was measured under conditions of a resin temperature of 280° C., a mold temperature of 80° C. and an injection pressure of 1,500 kgf/cm² was 220 mm. A flat square plate having a thickness of 1.2 mm and a length of 150 mm was formed from the pellets using an injection molding machine at a cylinder temperature of 280° C. Test pieces were cut out from the plate for a bending test and an electromagnetic shielding test by a KMC method. Two holes having a diameter of 3 mm were formed on the test piece at an interval of 120 mm and metal nuts were inserted into the holes to determine the resistance between these nuts. The results are shown below. The resin components in the molded article were removed as described below, and the lengths of the residual carbon fibers were determined by a real time image analyzer LUZEX FS made by Nireco Corporation. The content of carbon fibers having a length of 0.1 mm or more was 35%.

Flexural strength: 18 kgf/mm$^2$

Flexural modulus: 1,800 kgf/mm$^2$

Electromagnetic shielding: 36 dB (at 300 MHz)

Resistance: 14 Ω

(Removal of Resin Component)

The test piece was allowed to stand at 40° C. for 40 minutes in an air/nitrogen 1:1 mixture, was heated at a heating rate of 5° C./min. to 450° C. and was maintained at 450° C. for 20 minutes to remove the resin component.

A prismatic molded article having a height of 20 mm, a length of 300 mm, a width of 210 mm (corresponding to size A4) and a thickness of 1.2 mm, wherein the boundary between two side walls and a curvature of 3 mm and a thickness of 1.8 mm, was formed by injection molding. For a drop impact test, an aluminum plate having a thickness of 17.6 mm, a length of 297.5 mm, a width of 207.5 mm, for a weight of 2.955 kg, or approximately 3 kg, was fixed onto the bottom face of the prismatic molded article, and the prismatic molded article was dropped onto a wood plate such that a corner between a boundary of two side walls and the bottom face is the lowest position. The test started with the molded article at a height of 25 mm, and the height was increased by 25 mm if the molded article was not broken. The molded article remained unbroken at a height of 250 mm, and some cracks formed at a height of 275 mm.

Comparative Example 1

The semi-aromatic nylon used in Example 1 and carbon fiber were kneaded in and extruded from an extruder to prepare carbon fiber-reinforced pellets. The carbon fiber content in the pellets was 29.5 percent by weight.

The spiral flow length of the pellet, the flexural characteristics, the electromagnetic shielding and the resistance between two nuts of a molded article injected from the pellets were measured as in Example 1. The results were as follows:

Spiral flow length: 284 mm

Flexural strength: 30.4 kgf/mm$^2$

Flexural modulus: 2,750 kgf/mm$^2$

Electromagnetic shielding: 46 dB (at 300 MHz)

Resistance: 12 Ω

A prismatic molded article having the same size as the molded article of Example 1 was formed from the pellets using an injection molding machine and the minimum height required to break the molding article was determined. The molding article remained unbroken at 10 mm, and some cracks formed at 15 mm.

Example 2

A resin blend containing 50 parts by weight of semi-aromatic nylon (the same as above) and 50 parts by weight of nylon 66 (trade name Amilan, made by Toray Industries, Inc.), and carbon fiber were kneaded in and extruded from an extruder to prepare carbon fiber-reinforced pellets. The pellets contained 29.0 percent by weight of carbon fiber.

The spiral flow length of the pellet, the flexural characteristics, the electromagnetic shielding and the resistance between two nuts of a molded article injected from the pellets were measured as in Example 1. The results were as follows:

Spiral flow length: 203 mm

Flexural strength: 32.5 kgf/mm$^2$

Flexural modulus: 2,814 kgf/mm$^2$

Electromagnetic shielding: 40 dB (at 300 MHz)

Resistance: 12 Ω

A prismatic molded article having the same size as the molded article of Example 1 was formed from the pellets using an injection molding machine and the minimum height required to break the molding article was determined. The molding article remained unbroken at 200 mm, and some cracks formed at 225 mm.

Example 3

A resin blend containing 50 parts by weight of semi-aromatic nylon (the same as above), 25 parts by weight of nylon 6 (the same as above) and 25 parts by weight of nylon 66 (the same as above), and carbon fiber were kneaded in and extruded from an extruder to prepare carbon fiber-reinforced pellets. The pellets contained 31.0 percent by weight of carbon fiber.

The spiral flow length of the pellet, the flexural characteristics, the electromagnetic shielding and the resistance between two nuts of a molded article injected from the pellets were measured as in Example 1. The results were as follows:

Spiral flow length: 210 mm

Flexural strength: 24.3 kgf/mm$^2$

Flexural modulus: 2,300 kgf/mm$^2$

Electromagnetic shielding: 38 dB (at 300 MHz)

Resistance: 8.8 Ω

A prismatic molded article having the same size as the molded article of Example 1 was formed from the pellets using an injection molding machine and the minimum height required to break the molding article was determined. The molding article remained unbroken at 225 mm, and some cracks formed at 250 mm.

Example 4

A resin blend containing 50 parts by weight of semi-aromatic nylon (the same as above) and 50 parts by weight of nylon 6 (the same as above) was melted and impregnated into a continuous carbon fiber bundle to prepare a strand. The strand was cut off to prepare carbon fiber-reinforced plastic pellets having a length of 3 cm. The pellets contained 29.5 percent by weight of carbon fiber.

The spiral flow length of the pellet, the flexural characteristics, the electromagnetic shielding and the resistance between two nuts of a molded article injected from the pellets were measured as in Example 1. The results were as follows:

Spiral flow length: 220 mm

Flexural strength: 17.9 kgf/mm$^2$

Flexural modulus: 1,820 kgf/mm$^2$

Electromagnetic shielding: 37 dB (at 300 MHz)

Resistance: 9.2 Ω

A prismatic molded article having the same size as the molded article of Example 1 was formed from the pellets using an injection molding machine and the minimum height required to break the molding article was determined. The molding article remained unbroken at 300 mm, and some cracks formed at 325 mm.

The length of the carbon fibers in the molded article was determined by the real time image analyzer shown in Example 1. The content of fibers having a length of 0.1 mm or more was 60%.

Example 5

A resin blend containing 50 parts by weight of semi-aromatic nylon (the same as above) and 50 parts by weight of nylon 6 (the same as above) was melted and impregnated into a continuous carbon fiber bundle to prepare a strand. The strand was cut off to prepare carbon fiber-reinforced plastic pellets having a length of 10 cm. The pellets contained 29.0 percent by weight of carbon fiber.

The spiral flow length of the pellet, the flexural characteristics, the electromagnetic shielding and the resistance between two nuts of a molded article injected from the pellets were measured as in Example 1. The results were as follows:

Spiral flow length: 217 mm

Flexural strength: 18.2 kgf/mm$^2$

Flexural modulus: 1,910 kgf/mm$^2$

Electromagnetic shielding: 42 dB (at 300 MHz)

Resistance: 7.3 Ω

A prismatic molded article having the same size as the molded article of Example 1 was formed from the pellets using an injection molding machine and the minimum height required to break the molding article was determined. The molding article remained unbroken at 350 mm, and some cracks formed at 375 mm.

The length of the carbon fibers in the molded article was determined by the real time image analyzer shown in Example 1. The content of fibers having a length of 0.1 mm or more was 80%.

Example 6

A resin blend containing 75 parts by weight of semi-aromatic nylon (the same as above) and 25 parts by weight of nylon 6 (the same as above), and carbon fiber were kneaded in and extruded from an extruder to prepare carbon fiber-reinforced plastic pellets. The pellets contained 11.0 percent by weight of carbon fiber.

The spiral flow length of the pellet and the flexural characteristics of a molded article injected from the pellets were measured as in Example 1. The results were as follows:

Spiral flow length: 352 mm

Flexural strength: 11.7 kgf/mm$^2$

Flexural modulus: 1,050 kgf/mm$^2$

A prismatic molded article having the same size as the molded article of Example 1 was formed from the pellets using an injection molding machine and the minimum height required to break the molding article was determined. The molding article remained unbroken at 200 mm, and some cracks formed at 225 mm.

The length of the carbon fibers in the molded article was determined by the real time image analyzer shown in Example 1. The content of fibers having a length of 0.1 mm or more was 60%.

Example 7

A resin blend containing 75 parts by weight of semi-aromatic nylon (the same as above) and 25 parts by weight of nylon 6 (the same as above), and carbon fiber were kneaded in and extruded from an extruder to prepare carbon fiber-reinforced pellets. The pellets contained 44.5 percent by weight of carbon fiber.

The spiral flow length of the pellet, the flexural characteristics, the electromagnetic shielding and the resistance between two nuts of a molded article injected from the pellets were measured as in Example 1. The results were as follows:

Spiral flow length: 126 mm

Flexural strength: 32.1 kgf/mm$^2$

Flexural modulus: 3,100 kgf/mm$^2$

Electromagnetic shielding: 45 dB (at 300 MHz)

Resistance: 7.1 Ω

A prismatic molded article having the same size as the molded article of Example 1 was formed from the pellets using an injection molding machine and the minimum height required to break the molding article was determined. The molding article remained unbroken at 320 mm, and some cracks formed at 350 mm.

Example 8

A resin blend containing 60 parts by weight of semi-aromatic nylon (the same as above), 25 parts by weight of nylon 6 (the same as above), 10 parts by weight of brominated styrene (made by Great Lake Co., Ltd.) and 5 parts by weight of antimony trioxide, and carbon fiber were kneaded in and extruded from an extruder to prepare carbon fiber-reinforced pellets. The pellets contained 31.0 percent by weight of carbon fiber.

The spiral flow length of the pellet, the flexural characteristics, the electromagnetic shielding and the resistance between two nuts of a molded article injected from the pellets were measured as in Example 1. The results were as follows:

Spiral flow length: 225 mm

Flexural strength: 31.1 kgf/mm$^2$

Flexural modulus: 2,420 kgf/mm$^2$

Electromagnetic shielding: 38 dB (at 300 MHz)

Resistance: 11 Ω

A prismatic molded article having the same size as the molded article of Example 1 was formed from the pellets using an injection molding machine and the minimum height required to break the molding article was determined. The molding article remained unbroken at 225 mm, and some cracks formed at 250 mm.

A UL94 V test piece having a thickness of 1.2 mm was prepared from the pellets by injection molding to evaluate the flame retardance. The flame retardance satisfied V-0 requirements.

Example 9

A resin blend containing 67.5 parts by weight of semi-aromatic nylon (the same as above), 27.5 parts by weight of nylon 6 (the same as above), and 5 parts by weight of red phosphorus (made by Nippon Kayaku Co. Ltd.), and carbon fiber were kneaded in and extruded from an extruder to prepare carbon fiber-reinforced pellets. The pellets contained 31.0 percent by weight of carbon fiber.

The spiral flow length of the pellet, the flexural characteristics, the electromagnetic shielding and the resistance between two nuts of a molded article injected from the pellets were measured as in Example 1. The results were as follows:

Spiral flow length: 219 mm

Flexural strength: 34.6 kgf/mm$^2$

Flexural modulus: 2,310 kgf/mm$^2$

Electromagnetic shielding: 35 dB (at 300 MHz)

Resistance: 13 Ω

A prismatic molded article having the same size as the molded article of Example 1 was formed from the pellets using an injection molding machine and the minimum height required to break the molding article was determined. The molding article remained unbroken at 200 mm, and some cracks formed at 225 mm.

A UL94 V test piece having a thickness of 0.7 mm was prepared from the pellets by injection molding to evaluate the flame retardance. The flame retardance satisfied V-0 requirements.

In the present invention as described above, a semi-aromatic polyamide and an aliphatic polyamide are used together at a given ratio, and a carbon fiber-reinforced plastic composition composed of the polyamide resin mixture matrix and a predetermined amount of carbon fiber was used as a molding material. The molding material can provide a thin-wall, lightweight, electrically conductive casing for electronic devices, which has excellent antistatic and electromagnetic wave shielding characteristics and rigidity and satisfies the impact resistance represented by the above-mentioned equation (I), essential for the casing of a portable electronic device.

Since the spiral flow length of the carbon fiber-reinforced plastic composition used in the present invention is specified, a high-quality thin-wall casing without defects such as short-shots can be stably produced with high molding performance. Addition of an adequate amount of flame retardant in the plastic composition can provide the casing with excellent flame-retardance, and thus the casing is useful for portable electronic devices such as notebook-type personal computers.

What is claimed is:

1. An electrically conductive casing for an electronic device comprising a molded article which is comprised of a fiber-reinforced plastic composition comprising carbon fiber and polyamide, said polyamide comprising semi-aromatic polyamide and aliphatic polyamide in a weight ratio of 10:90 to 90:10, wherein said semi-aromatic polyamide is a polymer of an aromatic diamine and an aliphatic dicarboxylic acid.

2. An electrically conductive casing according to claim 1, wherein said aromatic diamine is m-xylylenediamine and said aliphatic dicarboxylic acid is adipic acid.

3. An electrically conductive casing according to claim 1, wherein said aliphatic polyamide is nylon 6 or nylon 66.

4. An electrically conductive casing according to claim 1, wherein at least 30 percent by weight of said carbon fiber has a length of 0.1 mm or more.

5. An electrically conductive casing according to claim 1, wherein the weight ratio of said carbon fiber to said polyamide is in a range from 10:90 to 45:55.

6. An electrically conductive casing according to claim 1, wherein said molded article has a flexural modulus in a range from 1,000 kgf/mm$^2$ to 4,500 kgf/mm$^2$.

7. An electrically conductive casing according to claim 1, wherein said fiber-reinforced plastic composition has a spiral flow length of 100 mm or more at a 1.2-mm thickness under conditions of a resin temperature of 280° C., a mold temperature of 80° C. and an injection pressure of 1,500 kgf/cm$^2$.

8. An electrically conductive casing according to claim 1, wherein said fiber-reinforced plastic composition further comprises a flame retardant and conforms UL94 V-0 within a thickness range from 0.7 to 1.2 mm.

9. An electrically conductive casing according to claim 8, wherein said flame retardant is red phosphorus.

10. An electrically conductive casing according to claim 8, wherein said flame retardant comprises red phosphorus and an inorganic compound.

11. An electrically conductive casing according to claim 1, wherein said electrically conductive casing has an electromagnetic shielding of 35 dB or more at a frequency of 300 MHz determined by a Kansai Electronic Development Center (KMC) method or has a resistance of 20 Ω or less between two metal nuts inserted into said casing at an interval of 120 mm.

* * * * *